(12) United States Patent
Hara et al.

(10) Patent No.: US 6,827,232 B1
(45) Date of Patent: Dec. 7, 2004

(54) RESIN CASE PROVIDING COMPATIBILITY BETWEEN AIR PERMEABILITY AND WATER PROOFING PROPERTY, AND MOLD FOR PRODUCING SUCH CASE

(75) Inventors: Kouichi Hara, Aichi-ken (JP); Atsushi Fukunishi, Aichi-ken (JP); Takahito Katsuura, Aichi-ken (JP)

(73) Assignee: Tokai Kogyo Co., Ltd. (JP)

( * ) Notice: Subject to any disclaimer, the term of this patent is extended or adjusted under 35 U.S.C. 154(b) by 0 days.

(21) Appl. No.: 09/831,861

(22) PCT Filed: Sep. 18, 2000

(86) PCT No.: PCT/JP00/06361
§ 371 (c)(1),
(2), (4) Date: Aug. 6, 2001

(87) PCT Pub. No.: WO01/20958
PCT Pub. Date: Mar. 22, 2001

(30) Foreign Application Priority Data
Sep. 16, 1999 (JP) .......................... 11-262101

(51) Int. Cl.⁷ .............................. B65D 51/16
(52) U.S. Cl. ...................... 220/371; 220/780; 220/792; 220/796
(58) Field of Search ................ 220/371, 780, 220/792, 796, 4.02, 363, 365, 373; 215/261, 317

(56) References Cited

U.S. PATENT DOCUMENTS

| 3,083,861 | A | * | 4/1963 | Amberg et al. ......... 220/371 X |
| 4,109,818 | A | * | 8/1978 | Hascoe et al. ............... 220/200 |
| 4,324,827 | A |   | 4/1982 | Obayashi et al. |
| 4,605,142 | A | * | 8/1986 | Itoh et al. ................. 220/359.4 |
| 4,618,071 | A | * | 10/1986 | Vincent ....................... 220/371 |
| 4,653,661 | A | * | 3/1987 | Buchner et al. ........ 220/203.16 |
| 4,661,326 | A | * | 4/1987 | Schainholz .................. 422/310 |
| 5,692,634 | A | * | 12/1997 | Jenkins et al. ........... 220/256.1 |
| 6,182,850 | B1 | * | 2/2001 | Marbler et al. .......... 220/359.3 |
| 6,196,409 | B1 | * | 3/2001 | Lake et al. ................. 220/371 |

FOREIGN PATENT DOCUMENTS

| DE | 19702 685 A1 | 7/1998 |
| DE | 10-328521 | 12/1998 |
| EP | 0 936 045 A1 | 8/1999 |
| JP | 60-177699 | 9/1985 |
| JP | 0 613 334 A1 | 8/1994 |
| JP | 7-272704 | 10/1995 |
| JP | 9-314585 | 12/1997 |

* cited by examiner

Primary Examiner—Joseph Man-Fu Moy
(74) Attorney, Agent, or Firm—Howson and Howson

(57) ABSTRACT

A through hole (50) with an annular groove (52) provided about its periphery is formed in a resin case (10). The through hole (10) is covered with a water/oil-repellent film (40) comprising a porous film (44). The through hole (50) makes the resin case (10) gas-permeable, and the water/oil-replacement film (40) prevents entry of external water and oil, etc.

12 Claims, 11 Drawing Sheets

(a)

(b)

(c)

(a)

(b)

(a)

(b)

(a)

(b)

(a)

(b)

(a)

(b)

(a)

(b)

(a)

(b)

RESIN CASE PROVIDING COMPATIBILITY BETWEEN AIR PERMEABILITY AND WATER PROOFING PROPERTY, AND MOLD FOR PRODUCING SUCH CASE

TECHNICAL FIELD

The present invention relates to a resin case required to be gas-permeable and waterproof, such as a connector-integrated case, etc. housing electric and electronic parts inside.

BACKGROUND ART

Circuits including electronic parts such as transistors, etc., and electric parts such as motors, etc. used for computers and their peripherals, are designed on substrates. These substrates, etc. are housed in resin cases (hereafter called "connector-integrated cases") wherein connectors are integrally formed. Terminals connected to the substrates, etc. protrude from the connectors to the outside of the boxes so that the terminals can be attached to other parts through the connectors.

FIG. 13 is a perspective view of a conventional connector-integrated case 100.

FIG. 14 is a cross-sectional view of a connector-integrated case 100' having the same construction as the connector-integrated case 100 except that it has a through hole 500 provided in a lid 300, and is equivalent to a cross-sectional view along the line 14—14, in FIG. 13.

The connector-integrated case 100 comprises a box 200 and a lid 300 made of resin such as plastic, etc. Inside a connector C provided on one side of the box 200, there is a plurality of terminals T protruding from within to the outside of the box 200 (see FIG. 14).

This terminal T is connected, at one end, to a circuit of a substrate B secured in the box 200 and is attachable, at the other end, to another member through the connector C.

After securing a substrate B inside the box 200, a seal packing (not shown) is placed between an end face of the box 200 and the lid 300. Then, the box 200 and the lid 300 are secured with screws, etc (not shown).

The connector-integrated case 100 like this has to be completely watertight so that moisture may not enter inside.

When there is communication between outside air and the inside of the connector-integrated case 100, conditions of the outside air such as outside air temperature and humidity, etc. may influence the substrate B inside the connector-integrated case 100.

In particular, when humid outside air is taken into the connector-integrated case 100, metal parts such as circuits, etc. of the substrate B are corroded by moisture contained in the outside air, often causing electrical contact failures.

Therefore, the connector-integrated case 100 must be highly airtight.

On the other hand, when electric and electronic parts in use inside the connector-integrated case 100 generate heat and the temperature inside the connector-integrated case 100 increases, the inside air may expand to produce high pressure. Further, under certain conditions, the internal pressure may become lower than atmospheric pressure, that is, it may become subatmospheric.

In order to cope with the thus-produced difference in pressure between the interior and exterior of the connector-integrated case 100, it is necessary to provide a through hole in the connector-integrated case 100. However, provision of such a through hole Inevitably lowers the waterproof quality and airtightness.

Therefore, in the past, as shown in a cross-sectional view of FIG. 14, a through hole 500 is formed in an upper surface of the lid 300 or in a side face of the box 200. The through hole 500 was covered with woven fabric, etc. preventing moisture and oil content from passing through, and allowing only air to pass, to equalize the internal and external pressures while maintaining a waterproof quality and airtightness.

An example of a woven fabric preventing moisture and oil content from passing through and allowing only air to pass is a porous film 400 made of fluorocarbon resin, etc., which is bonded to the box 200 or to the lid 300 by a double-sided tape or by an adhesive.

Since the porous film 400 covering the through hole 500 is made of fluorocarbon resin and the like, the double-sided tape and adhesive, etc. cannot achieve sufficient adhesion, and, as a result, the porous film 400 sometimes peels in use.

Therefore, in a certain connector-integrated case, the porous film 400 is cut into a circular shape and fitted into a metal ring, which is crimped to hold the porous film 400. Then the porous film 400, fitted in the metal ring, is secured to the required position on the box 200 or the lid 300 by insert molding or further crimping.

The porous film 400 is sometimes bonded at the required position on the box 200 or lid 300 by heat sealing or laser seizing.

However, it requires processing time to crimp a metal ring to the periphery of the porous film 400. Further, excessively strong crimping gives rise to the problem of damage to the porous film 400.

Further, bonding the porous film 400 by heat sealing or laser seizing, requires special equipment, resulting in additional cost. Also, during such procedures, it is difficult to locate the porous film 400 at the proper position with respect to the through hole 500. Further, since it is not possible to exert pressure to the porous film 400, sufficient bonding strength cannot be obtained.

In accordance with the invention, a through hole is provided in a sealed resin case, and the through hole is covered with a water/oil-repellent film, which is bonded to the resin case when the resin case is injection-molded. The resin case comprises a box and a lid covering an opening of the box, and the through hole is provided either in the box or in the lid. The water/oil-repellent film is a porous film and is preferably bonded to the resin case by causing the molten resin to enter the pores of the porous film. In a preferred embodiment, the water/oil-repellent film is made by laminating a backing comprising a thermoplastic material and a porous film, and the backing is melted so that it is bonded to the resin case. The joint of a periphery of the through hole and the water/oil-repellent film preferably form a U-shaped cross-section.

In accordance with another aspect of the invention, a die assembly for manufacturing a resin case comprises a first die having an inner surface and an annular protrusion on its inner surface, and a second die having a cylindrical protrusion receivable in the annular protrusion. A water/oil-repellent film is fitted into a recess surrounded by the annular protrusion of the first die, and when the first and second dies are closed the resin used to form the resin case is injected between the two dies. In a preferred embodiment, a pocket is provided either in the recess of the first die or in an end face of the protrusion of said second die, or in both the recess and the end face.

Since the through hole provided in the resin case of the present invention is covered with a water/oil-repellent film, communication of air is provided between the inside and outside of the case but moisture, etc. in the atmosphere do not enter the case. Also, since the water/oil-repellent film is bonded to the resin case when the resin case is injection-molded with molten resin, it is not easily peeled. Further, by using a die of the present invention, the water/oil-repellent film can be integrally bonded when molding the resin case.

BRIEF DESCRIPTION OF THE DRAWINGS

FIG. 1(a) is a perspective view; FIG. 1(b) is a vertical cross-sectional view along the line b—b in FIG. 1(a); and FIG. 1(c) is an enlarged fragmentary view of FIG. 1(b).

FIG. 4(a) is a perspective view; and FIG. 4(b) is a cross-sectional view along the line b—b in FIG. 4(a).

FIG. 5(a) is a perspective view; and FIG. 5(b) is a cross-sectional view along the line b—b in FIG. 5(a).

FIG. 6(a) is a perspective view; and FIG. 6(b) is a cross-sectional view along the line b—b in FIG. 6(a).

FIG. 7(a) is a perspective view; and FIG. 7(b) is a cross-sectional view along the line b—b in FIG. 7(a).

FIG. 8(a) is a perspective view; and FIG. 8(b) is a cross-sectional view along the line b—b in FIG. 8(a).

FIG. 10(a) is a cross-sectional view showing a condition in which the dies are opened; and FIG. 10(b) is a cross-sectional view showing a condition in which the dies are closed.

FIG. 11(a) is an enlarged fragmentary cross-sectional view in which a pocket is provided in a central region of an end face of the protrusion of the second die; FIG. 11(b) is an enlarged fragmentary cross-sectional view in which a pocket is provided in a central region of a recess of the first die; and FIG. 11(c) is an enlarged fragmentary cross-sectional view in which pockets are provided in the protrusion of the second die and in the recess of the first die.

FIG. 12(a) is an enlarged fragmentary cross-sectional view of a connector-integrated case molded by the first die with an annular protrusion; and FIG. 12(b) is an enlarged fragmentary cross-sectional view of a connector-integrated case molded by the first die without an annular protrusion.

BEST MODE FOR CARRYING OUT THE INVENTION

Figure 1:
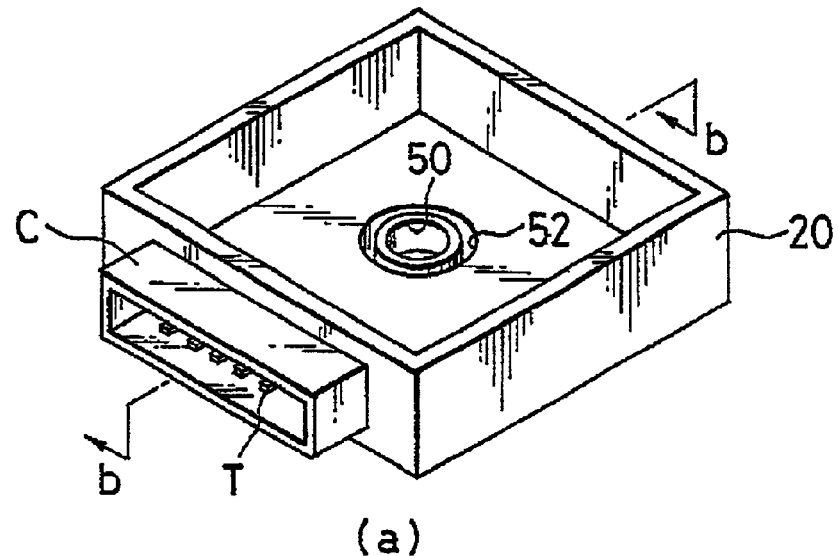
FIG. 1 shows a connector-integrated case of a first embodiment of the present invention.
Figure 1:
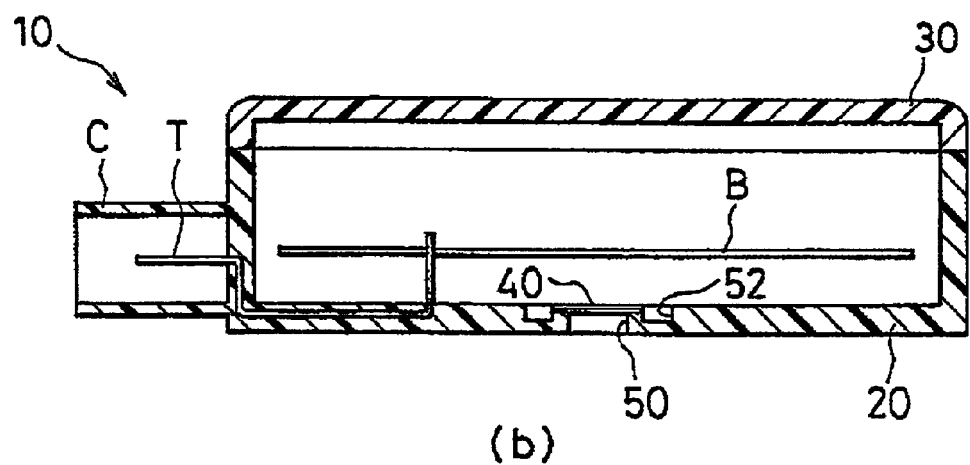
Figure 1:
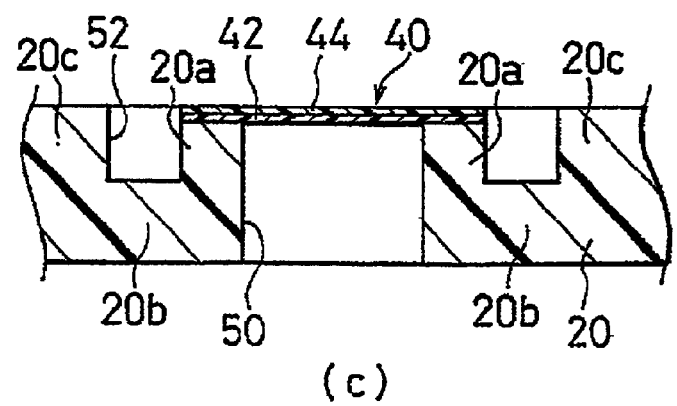

FIG. 1 shows a resin case 10 of the first embodiment of the present invention; FIG. 1(a) is a perspective view of a box 20; FIG. 1(b) is a cross-sectional view along the line b—b in FIG. 1(a), in which the substrate B is housed in the box 20 and a lid 30 is attached; and FIG. 1(c) is an enlarged fragmentary cross-sectional view of FIG. 1(b).

The resin case 10 is a connector-integrated case comprising the injection molded plastic box 20 and the lid 30, wherein the connector C is provided on one side of the box 20. Hereafter, the resin case 10 is called a "connector-integrated case".

In the connector C, there is a plurality of terminals T protruding outwardly from the inside of the box 20.

A conventionally known porous film is, a polytetrafluoroethylene (PTFE), which allows gases such as air to pass through but repels liquids such as water and oil.

An example of such PTFE porous films is one having micropores of about 0.1–3 $\mu$, formed at a density of several billion pores/cm$^2$. Examples of specific products on the market are "Microtek", etc. films, of Nitto Denko Corp.

This PTFE porous film 44 is laminated on a backing 42 comprising a polyethylene terephthalate (PET) non-woven or woven fabric with a water/oil-repelling property imparted to it to form a water/oil-repellent film 40.

A circular through hole 50 is formed in a bottom portion of the box 20 and, on an inner surface of the bottom portion, an annular groove 52 is provided around the through hole 50.

Consequently, as shown in FIG. 1(c), the cross section around the through hole 50 becomes substantially L-shaped, and it comprises a tip end (vertical thin wall) 20a extending in the shape of L, a mid-portion (horizontal thin wall) 20b below the annular groove 52, and a base end portion (general portion) 20c.

On the inner surface of the bottom portion, i.e., on the upper end face of the tip end portion (vertical thin wall) 20a, the above described water/oil-repellent film 40 is fusion-bonded so as to cover the through hole 50.

Since the through hole 50 for providing communication between interior of the case and outside air is formed in the connector-integrated case 10, there is no difference in pressure between the interior and exterior of the connector-integrated case 10.

Further, since the through hole 50 is covered with the water/oil-repellent film 40 which allows air to pass but prevents liquids such as water and oil, etc. from passing through, oil content and moisture in the atmosphere do not enter the case 10.

Figure 2:
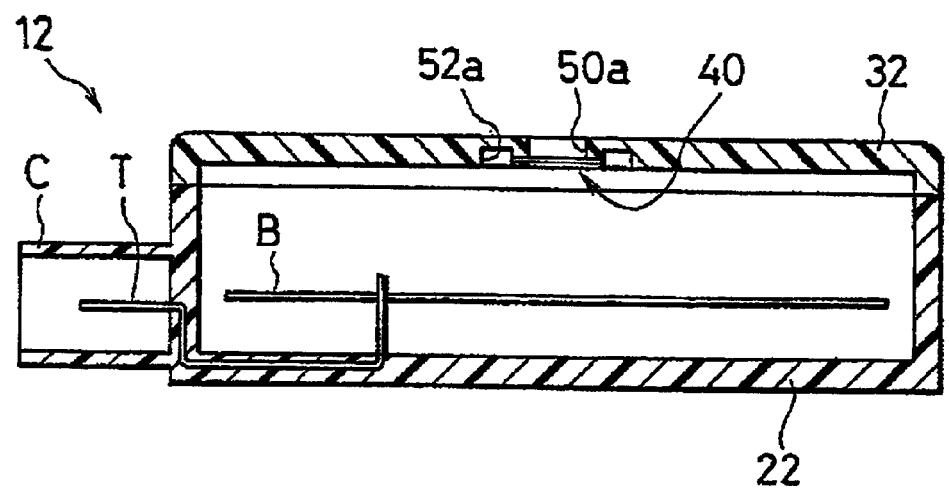
FIG. 2 is a vertical cross-sectional view of a connector-integrated case of a second embodiment of the present invention.

FIG. 2 is a cross-sectional view of a resin case 12 of a second embodiment of the present invention.

The resin case 12, like the one in the first embodiment, is a connector-integrated case comprising a box 22 and a lid 32, wherein a connector is provided on one side of the box 22 and, in addition, a through hole 50a and an annular groove 52a are provided in the lid 32.

Also, the through hole 50a is covered with the same water/oil-repellent film 40 as described above.

Figure 3:
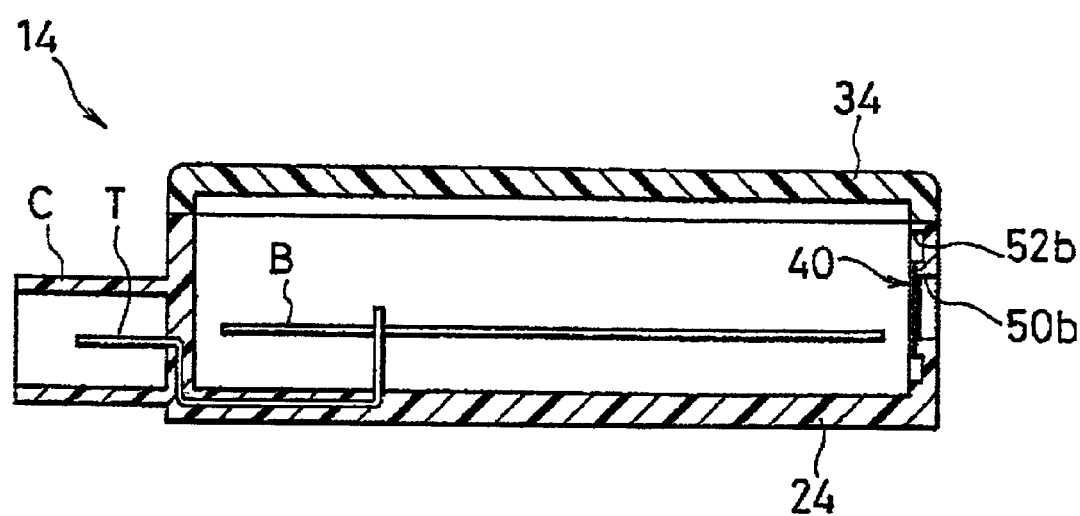
FIG. 3 is a vertical cross-sectional view of a connector-integrated case of a third embodiment of the present invention.

FIG. 3 is a cross-sectional view of a resin case 14 of the third embodiment of the present invention. This resin case 14 also is a connector-integrated case, like the one described above, comprising a box 24 and a lid 34. However, a through hole 50b and an annular groove 52b are provided in one side of the box 24 and the through hole 50b is covered with the water/oil-repellent film 40.

These connector-integrated cases 12 and 14 also have the through holes 50a, 50b in the lid 32 or box 24 so that there is no difference in pressure between the interior and exterior of the connector-integrated cases 12 and 14.

Further, since the through holes 50a, 50b are covered with the water/oil-repellent film 40, moisture, etc. in the atmosphere do not enter the connector-integrated cases 12, 14.

As described above, since it is possible to achieve gas-permeability and waterproof quality compatibly, the resin case of the present invention is suitable not only for connector-integrated cases but also for other applications.

FIGS. 4 through 8 show an automobile light case 100a, a motor case 100b, a cellular phone case 100c, an outdoor lamp case 100d and a copier toner case 100e. Further, in FIGS. 4 through 8, (a) is a perspective view and (b) is a cross-sectional view along the line b—b in (a).

Figure 4:
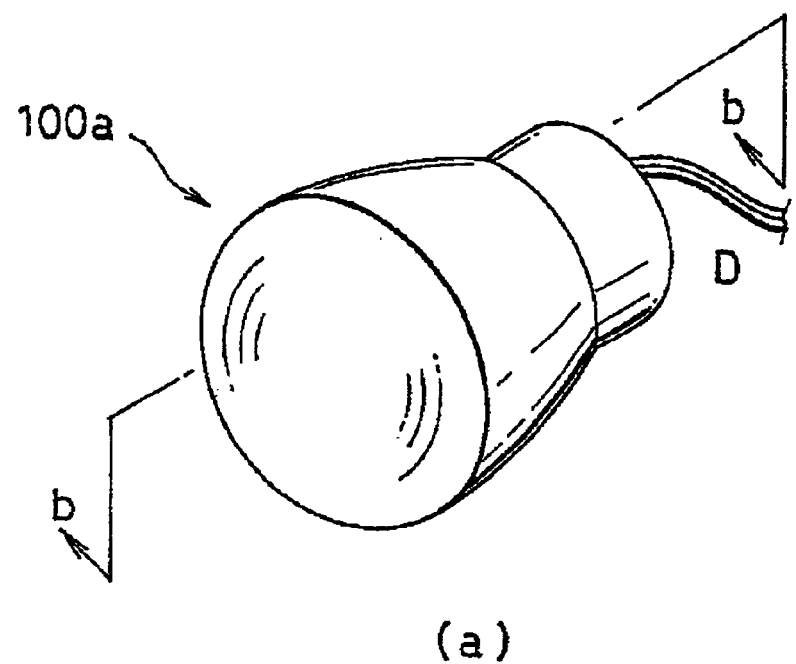
FIG. 4 shows an automobile light case, which is a resin case in accordance with the present invention.
Figure 4:
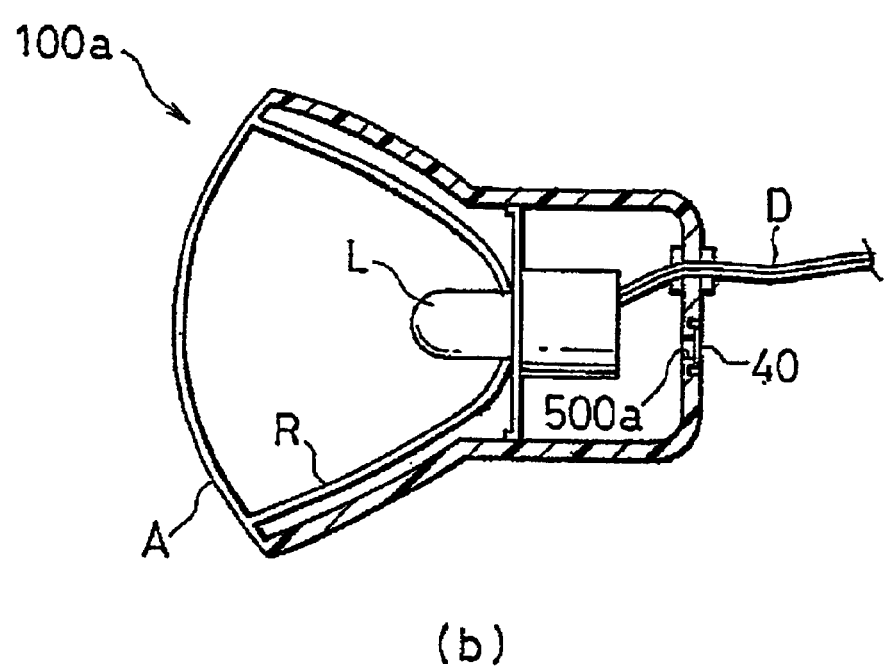

A light L is housed in the automobile light case 100a in FIG. 4, and a power cable D protrudes externally of the case. Further, reference characters R and A denote a reflector and a lens, respectively.

Figure 5:
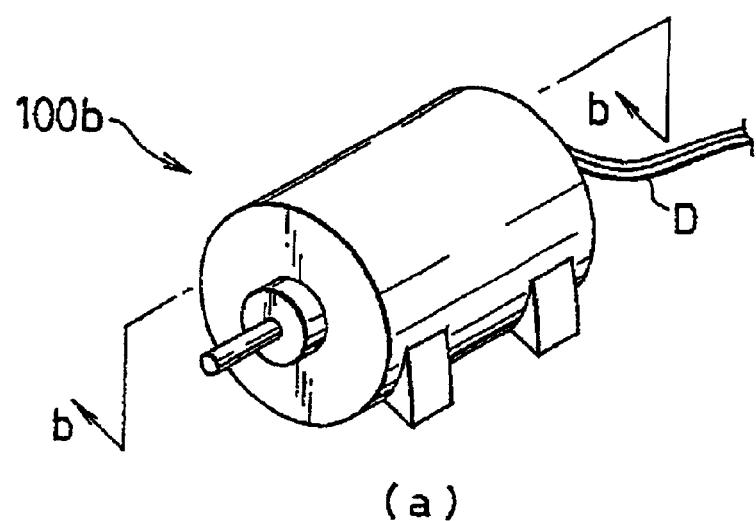
FIG. 5 shows a motor case, which is a resin case in accordance with the present invention.
Figure 5:
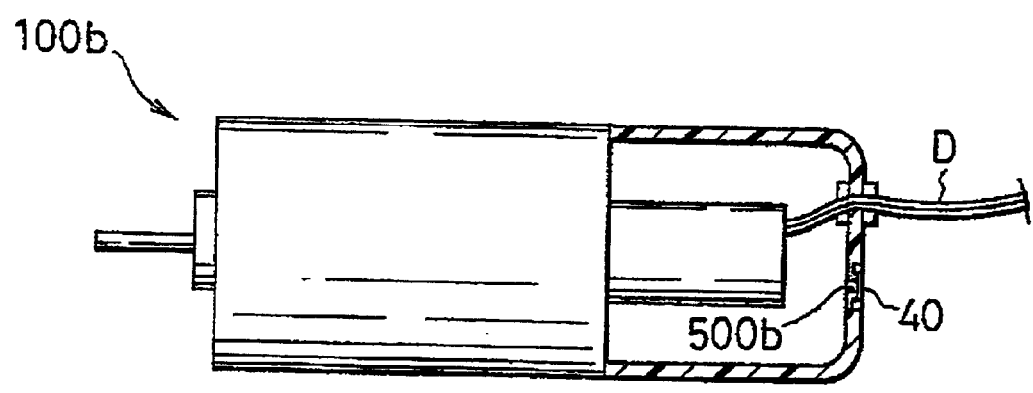

A motor is housed in the motor case 100b of FIG. 5, and the power cable D protrudes externally of the case.

Figure 6:
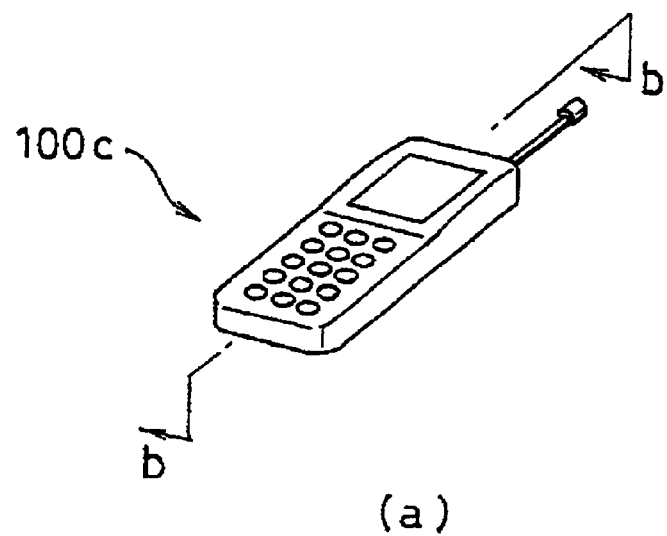
FIG. 6 shows a cellular phone case, which is a resin case in accordance with the present invention.
Figure 6:
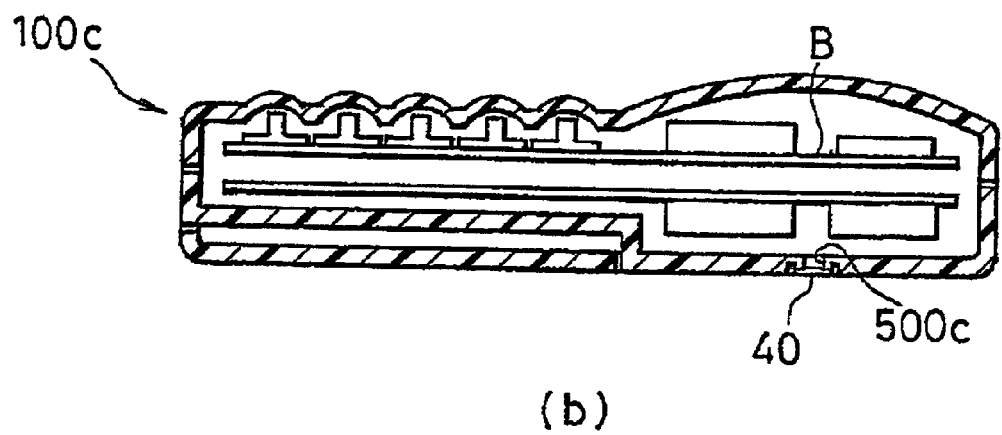

An electric/electronic substrate B, etc. are housed in the cellular phone case 100c shown in FIG. 6.

Figure 7:
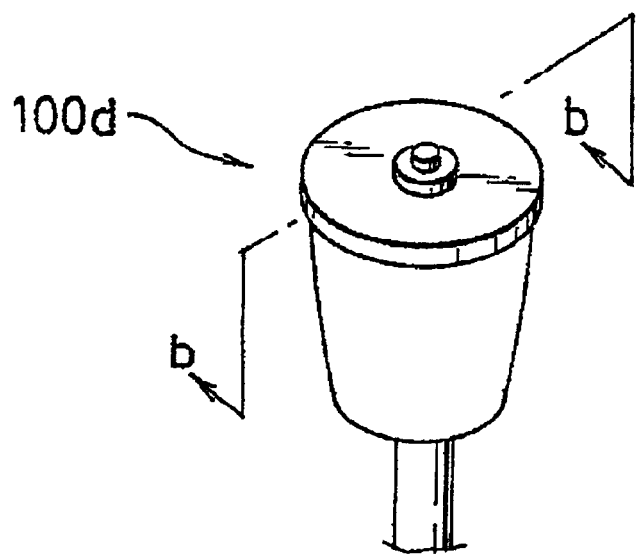
FIG. 7 shows an outdoor lamp case, which is a resin case in accordance with the present invention.
Figure 7:
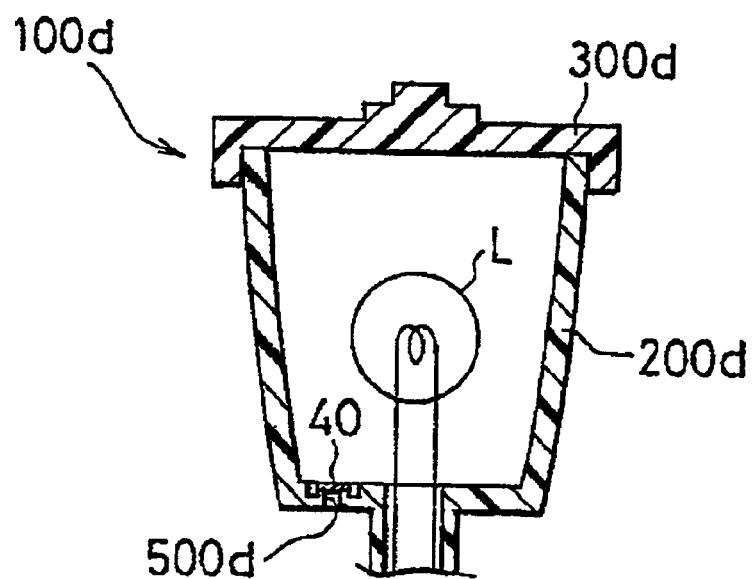

The outdoor lamp case 100d of FIG. 7 comprises a main unit 200d of the case and a lid 300d, and the light L is housed inside.

Figure 8:
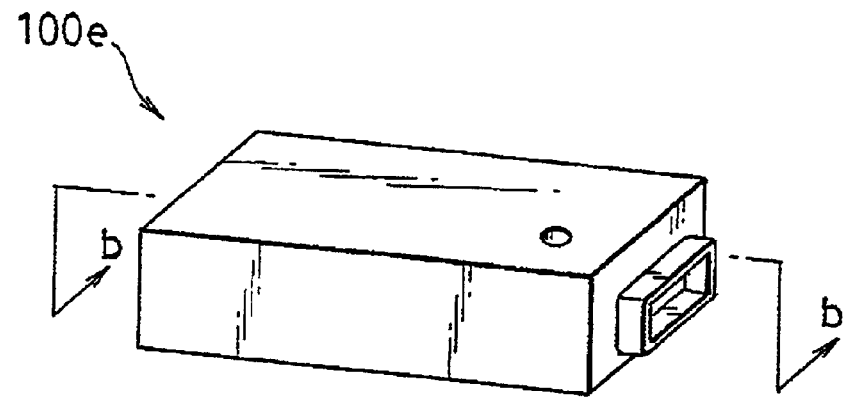
FIG. 8 shows a copier toner case, which is a resin case in accordance with the present invention.
Figure 8:
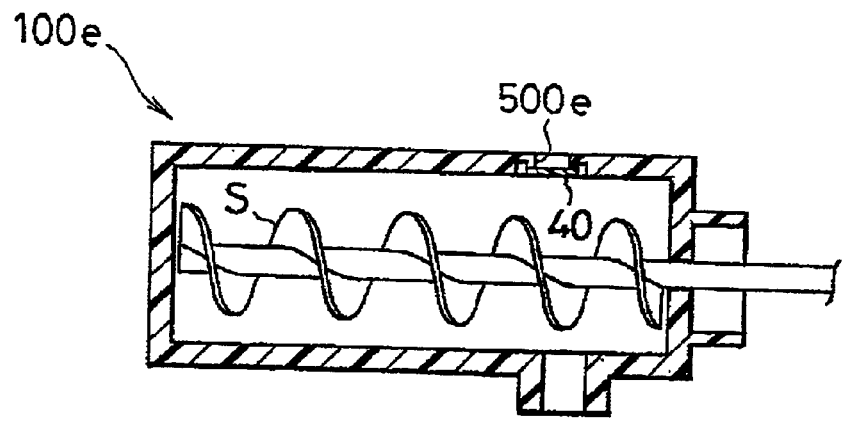

The copier toner case 100e of FIG. 8 is filled with toner, which is stirred by a rotating screw S.

These cases 100a, 100b, 100c, 100d and 100e have, like the previously described connector-integrated cases, through holes 500a, 500b, 500c, 500d and 500e, which are covered with the water/oil-repellent film 40.

The positions of the through holes differ according to the cases. In the drawings, the through holes are provided in the side faces of the automobile light case 100a and the motor case 100b. Also, the through holes are provided in bottom surfaces of the cellular phone case 100c and the outdoor lamp case 100d, and in an upper surface of the copier toner case 100e, respectively.

Since these resin cases 100a, 100b, 100c, 100d and 100e have the through holes 500a, 500b, 500c, 500d and 500e, electric/electronic parts such as lights and motors, etc. housed inside do not generate heat. Further, even when outdoor temperature changes, there is no difference in pressure produced between the interior and exterior of the cases.

Further, since the through holes 500a, 500b, 500c, 500d and 500e are covered with the water/oil-repellent film 40, moisture in the atmosphere does not enter the case.

Particularly, with regard to the automobile light case 100a, the cellular phone case 100c and the outdoor lamp case 100d, moisture does not enter the cases even when such cases are used outdoor and get wet in rainwater, etc.

Also, with regard to the copier toner case 100e, the toner does not scatter externally of the case even when the screw S provided inside rotates.

Next, the die for manufacturing the resin case of the present invention will be described with reference to a die for manufacturing a connector-integrated case.

Further, the connector-integrated cases 10, 12, 14 of the embodiments 1 through 3 are of the same construction except for the positions of the through holes 50, 50a, 50b as described above, and are manufactured by the same method.

Therefore, in the following paragraphs, a manufacturing method of the connector-integrated case 10 of the first embodiment alone will be described.

Figure 10:
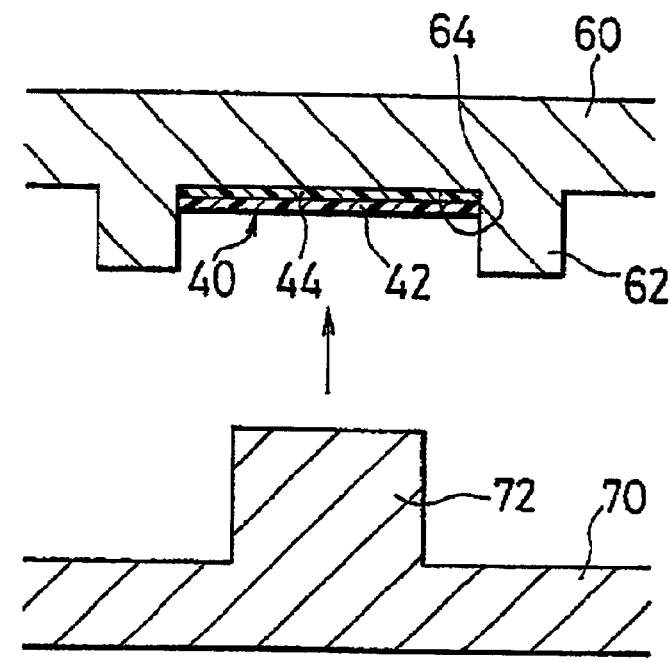
FIG. 10 shows dies for manufacturing the connector-integrated case of FIG. 1.
Figure 10:
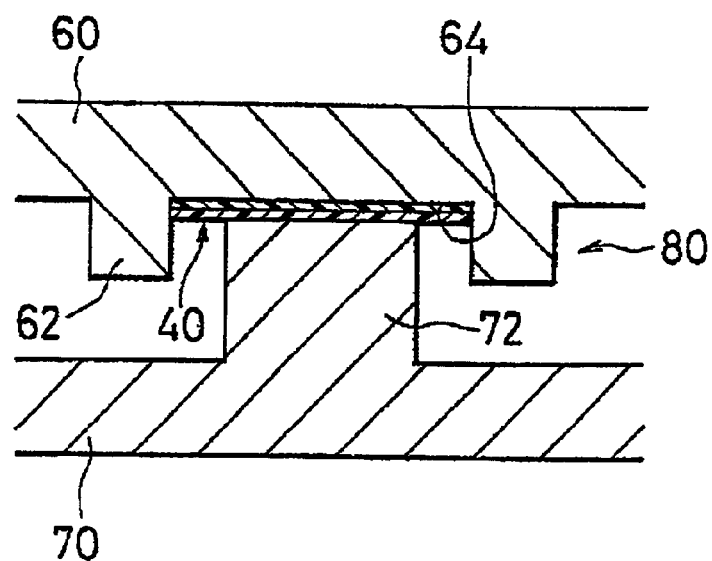

FIG. 10 is an enlarged cross-sectional view of a die comprising a first die 60 and a second die 70; FIG. 10(a) shows a condition in which both dies 60, 70 are opened; and FIG. 10(b) shows a condition in which both dies 60, 70 are closed.

A circular recess 64 surrounded by an annular protrusion 62 is provided in the first die 60, and a cylindrical protrusion 72 located at the central portion of the recess 64 of the first die 60 is provided on the second die 70.

As shown in FIG. 10(b), a cavity 80 is formed between the two closed dies 60, 70.

When the dies 60 and 70 are opened, the water/oil-repellent film 40 is fitted in the recess 64 of the first die 60 (see FIG. 10(a)) so that an inner surface of the recess 64 and a surface of the porous film 44 of the water/oil-repellent film 40 come into contact with each other. Then the two dies 60, 70 are closed. When molten resin is injected into the cavity 80 formed between the two dies 60, 70, the backing 42 of the water/oil-repellent film 40 fitted into the recess 64 of the first die 60 is melted by the heat of the resin and becomes integral with the resin to be injection-molded (insert molding).

As described above, by using the die for manufacturing the connector-integrated case of the present invention, the water/oil-repellent film 40 becomes integral with the box 20 when the box 20 is injection-molded. Therefore, the process of attaching the water/oil-repellent film 40 can be omitted.

Further, it is easy to position the water/oil-repellent film 40 with respect to the through holes 50, 50a and 50b.

Further, since the water/oil-repellent film 40 is melted by heat for bonding to the box 20, the bonding strength thereof is sufficient to prevent the film 40 from peeling.

Further, during the injecting-molding, the water/oil-repellent film is evenly pressed by the molten resin under high pressure (300 kgf/cm$^2$ or more), the molded box 20 and the water/oil-repellent film 40 are strongly bonded.

As a resin for injection molding when manufacturing the connector-integrated case, it is desirable to use a resin whose temperature when being molded is higher than the melting point of the backing 42 making up the water/oil-repellent film If PET (whose melting point is 264° C.) is used for the backing 42, a resin having a temperature of 264° C. or higher when being molded, such as (polybutylene terephthalate (PBT), polyphenylene sulfide (PPS). and polycarbonate (PC), etc. are suitable as resins for injection molding.

The porous film 44 making up the water/oil-repellent film 40 is easily destroyed when pressed from the outside. Therefore, when the protrusion 72 of the second die 70 is pressed against the water/oil-repellent film 40 placed inside the recess 64 of the first die 60, the porous structure of the water/oil-repellent film 40 may be crushed and pores thereof may be closed.

Therefore, it is desirable to provide a pocket in the recess of the first die and/or in the protrusion of the second die so as to relieve the pressing force against the water/oil-repellent film.

Figure 11:
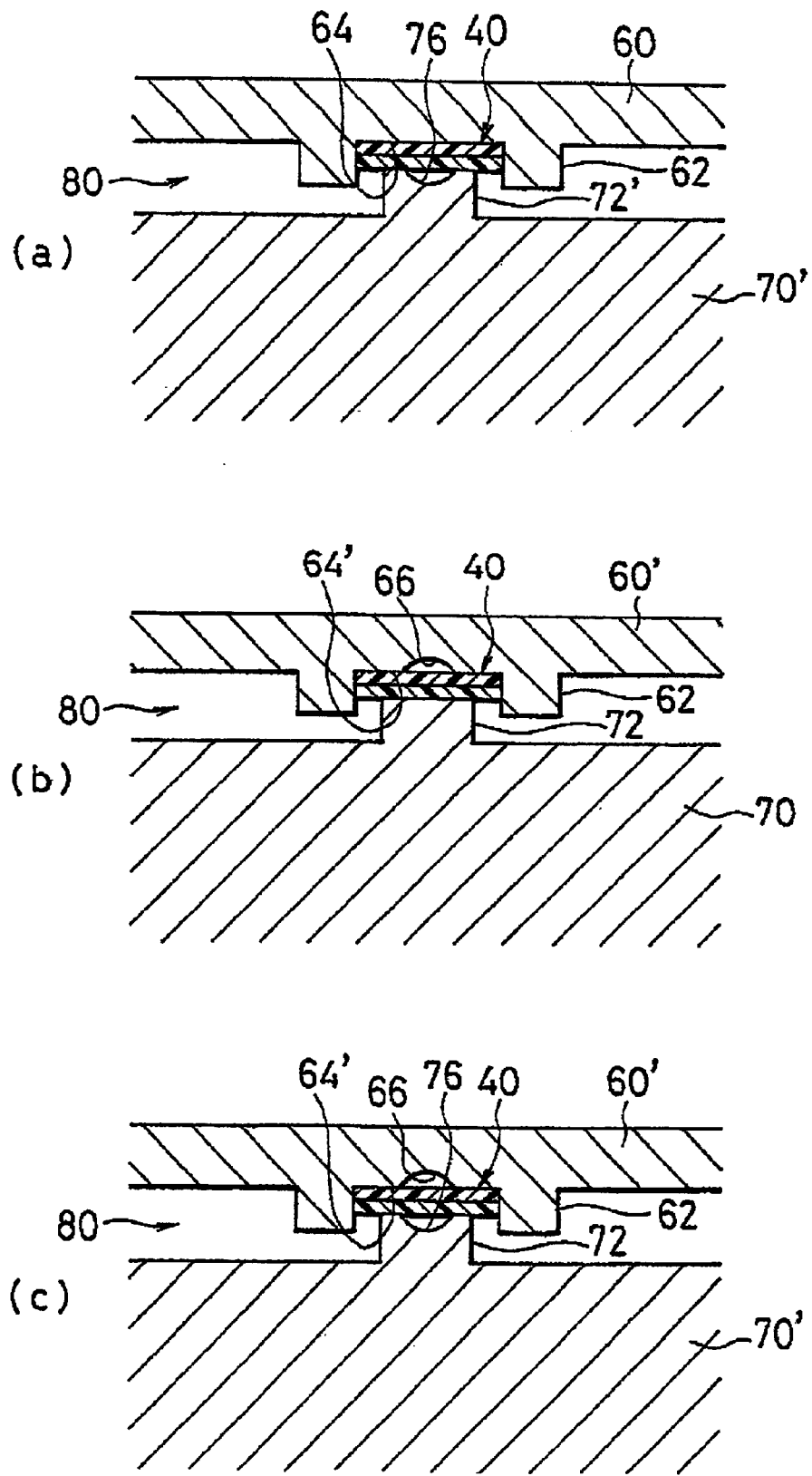
FIG. 11 shows a die designed to relieve pressing force against the water/oil-repellent film.

FIG. 11 is a fragmentary enlarged cross-sectional view of the die having a structure in which the pressing force against the water/oil-repellent film 40 is relieved; FIG. 11(a) shows that a pocket 76 is provided in a central region of an end face of the protrusion 72' of the second die 70'; FIG. 11(b) shows that a pocket 66 is provided in a central region of the recess 64' of the first die 60'; and FIG. 11(c) shows that pockets 66, 76 are provided in the recess 64' of the first die 60' and in the protrusion 72' of the second die 70', respectively.

If the pocket 76 is provided in the end face of the protrusion 72' of the second die 70' as in FIG. 11(a) and the pocket 66 is provided in the recess 64' of the first die 60' as in FIG. 11(b), pressing forces at the inner surface of the recess of the first die and the end face of the protrusion of the second die can be relieved when the first die and the second die are closed. Therefore, the porous structure of the central portion of the water/oil-repellent film 40 is not crushed.

Further, as in FIG. 11(c), when the pockets 66, 76 are provided in both the recess 64' of the first die 60' and the end face of the protrusion 72' of the second die 70', the pressing force against the water/oil-repellent film 40 can be more effectively relieved.

The annular protrusion 62 of the first die 60 not only makes it easy to position the water/oil-repellent film 40 but also causes the pressure of resin to be exerted perpendicularly against the water/oil-repellent film 40 when the resin is injected into the cavity 80, thus making it possible to fusion-bond the water/oil-repellent film 40 reliably.

Figure 12:
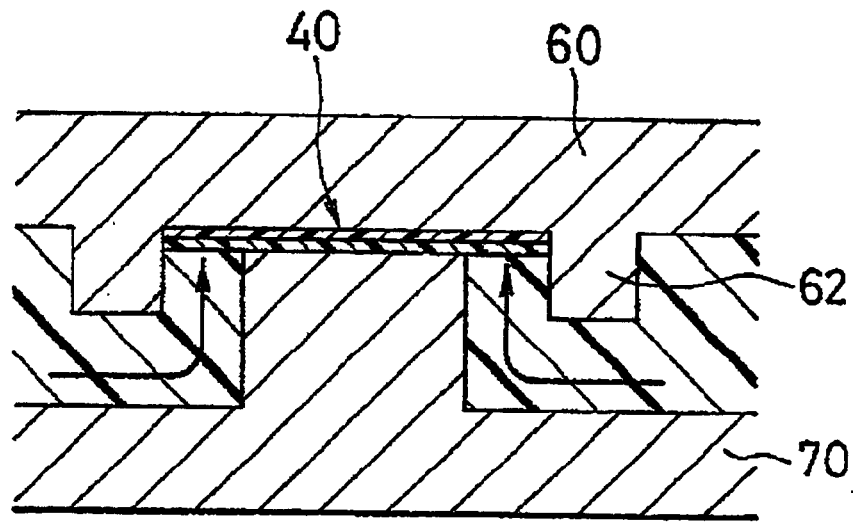
FIG. 12 is a view illustrating the flow of resin in a cavity.
Figure 12:
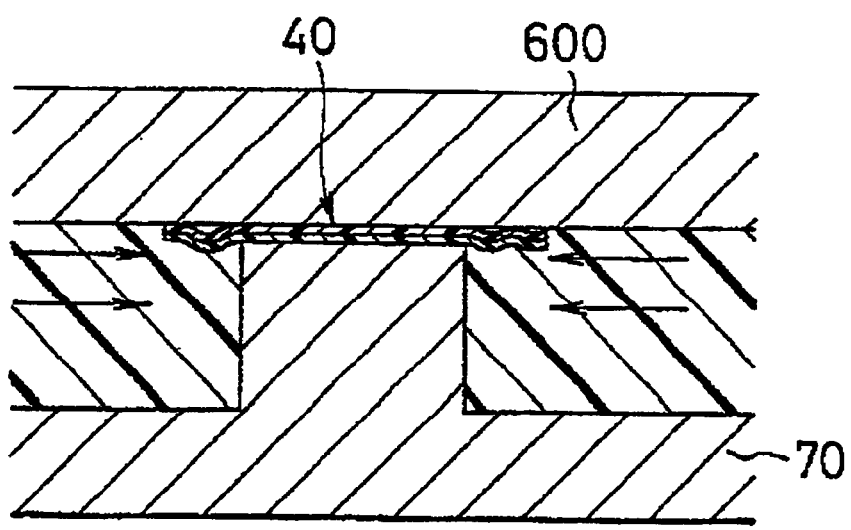
Figure 13:
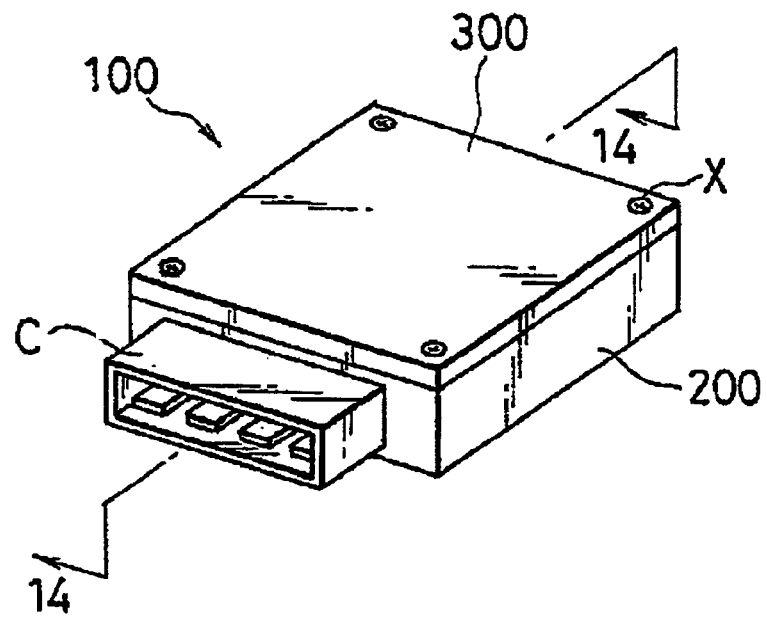
FIG. 13 is a perspective view of a conventional connector-integrated case.
Figure 14:
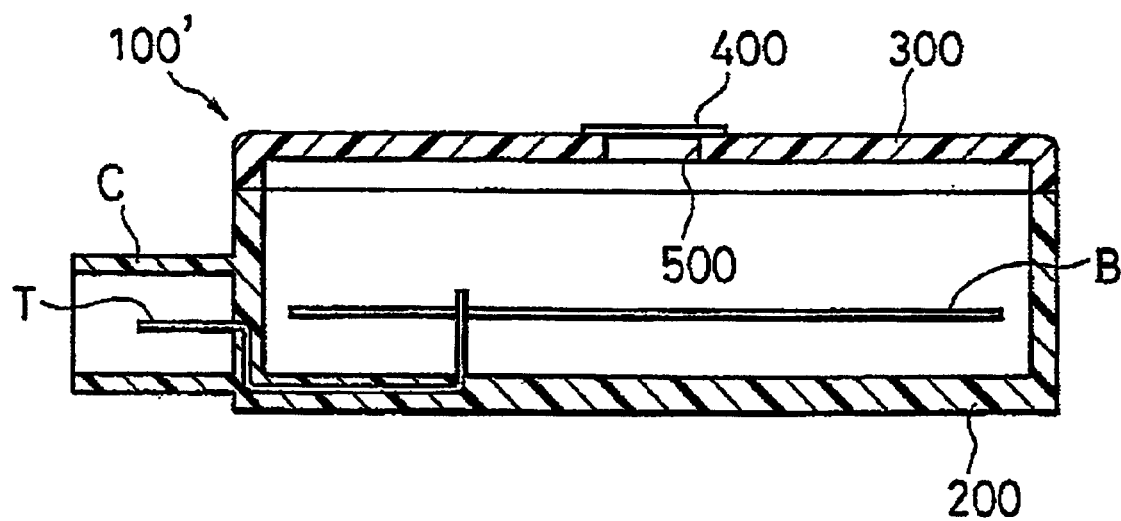
FIG. 14 is a cross-sectional view of another conventional connector-integrated case.

FIG. 12(a) is an enlarged cross-sectional view illustrating a flow of resin in the cavity of the connector-integrated case of the invention molded by using the first die 60 with the annular protrusion 62, and FIG. 12(b) is an enlarged cross-sectional view illustrating flow of resin in the cavity of the connector-integrated case of the invention molded by using a first die 600 without an annular protrusion.

If the first die is not provided with the annular protrusion, it is difficult to position the water/oil-repellent film 40, as shown in FIG. 12(b). Besides, since the molten resin flows parallel to the water/oil-repellent film 40 as shown by the arrow in FIG. 12(b), an end portion of the water/oil-repellent film 40 may be deformed by the pressure of the resin.

On the other hand, as shown in FIG. 12(a), when the annular protrusion 62 is provided on the first die 60, the molten resin flows in perpendicularly to the water/oil-repellent film 40, as shown by the arrow in the drawing, so that the water/oil-repellent film 40 and the resin are efficiently fusion-bonded.

When looking at this from the aspect of the shape of the connector-integrated case to be molded, the periphery of the through hole and the melted joint of the water/oil-repellent film form a U-shaped cross-section.

As shown in FIGS. 10 and 11, using the die of the present invention, the annular protrusion 62 is provided on the first dies 60, 60', and the water/oil-repellent film 40 is fitted and retained in the recesses 64, 64' surrounded by the annular protrusion 62, so that it is easy to position the water/oil-repellent film 40, and prevent it from sliding when the dies 60, 60', 70, 70' are closed.

Figure 9:
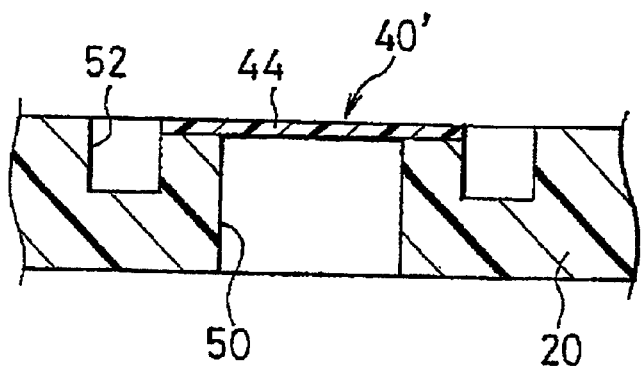
FIG. 9 is an enlarged fragmentary cross-sectional view of a resin case using a water/oil repellent film made up of a porous film only.

In the above-described resin case, a water/oil-repellent film 40 comprising a backing 42 with a porous film 44 laminated thereon is used. However, it is possible to bond the porous film 44 alone without using the backing 42. In this case, it is possible to use dies shown in FIGS. 10 and 11. Since the porous film 44 is made of PTFE having a melting point of 327° C. or higher, it is not melted by the heat of the molten resin (whose melting point is 264° C. in the case of PET) injected into the cavity. The injected molten resin enters pores of the porous film 44 to be integral with it and, as a result of this, the porous film 44 is bonded to the resin case. FIG. 9 is an enlarged fragmentary cross-sectional view of the resin case using a water/oil-repellent film 40'comprising the porous film 44 alone.

It is needless to say that the die for manufacturing the connector-integrated case of the present invention described above can be used when forming the connector-integrated cases 12, 14 of the second and third embodiments shown in FIG. 2 and 3.

Further, when manufacturing the resin case shown in FIGS. 4 through 8, a die having a shape suitable for the resin case may be used.

INDUSTRIAL APPLICABILITY

As described above, the resin case of the present invention is made so as to be both gas-permeable and waterproof by the through hole and the water/oil-repellent film covering the through hole. Thus, while there is no difference in pressure between the interior and exterior of the case, moisture from the outside does not enter the case.

By using the die for manufacturing the resin case according to the present invention, it is possible to injection-mold the case and integrally bond the water/oil-repellent film covering the through hole. Therefore, the water/oil-repellent film can be attached without additional equipment and processes.

Since the annular protrusion is provided on the first die, it is easy to position the water/oil-repellent film. Also, since the water/oil-repellent film is placed inside the first die before being pressed by the second die, it will not slide during the injection molding.

Further, since the water/oil-repellent film is bonded to a bonding surface of the case by the perpendicular pressure of the resin, it can be bonded with high bonding strength.

What is claimed is:

1. A sealed case for housing equipment, said case comprising an injection molded resin body having an interior and an exterior, and having a through hole leading from said interior to said exterior, wherein said through hole has a periphery, wherein the portion of the resin body surrounding said periphery of the through hole comprises a boss surrounded by an annular groove, wherein said boss has a radial tip surface, wherein said through hole is covered with a water-repellent, porous, film which is permeable to air, but impermeable to liquids, wherein said water-repellent film overlies and is bonded to said tip surface by entry of said molten resin into pores of said film due to pressure applied to the molten resin when said molten resin is injection-molded, and wherein only one side of said film is bonded to said boss.

2. A sealed case according to claim 1, wherein said case comprises a box and a lid covering an opening of said box, and said through hole is provided in said box or said lid.

3. A sealed case according to claim 1, wherein said film is also oil-repellent.

4. A sealed case according to claim 2, wherein said film is also oil-repellent.

5. A sealed case for housing equipment, said case comprising an injection molded resin body having an interior and an exterior, and having a through hole leading from said interior to said exterior, wherein said through hole is covered with a water-repellent film which is permeable to air but impermeable to liquids, wherein said through hole has a periphery, and wherein the portion of the resin body surrounding said periphery of the through hole comprises a boss surrounded by an annular groove, and wherein said boss has a radial tip surface, and said water-repellent film overlies, and is bonded to, said tip surface by heat and/or pressure applied by the molten resin of which said resin body is formed when said molten resin is injection-molded, and only one side of said film is bonded to said tip surface of said boss.

6. A sealed case according to claim 5, wherein said film is also oil-repellent.

7. A sealed case according to claim 5, wherein said water-repellent film is bonded to said tip surface by entry of said molten resin into pores of said film due to pressure applied to the molten resin when said molten resin is injection-molded.

8. A sealed case according to claim 7, wherein said film is also oil-repellent.

9. A sealed case according to claim 5, wherein said water-repellent film is a laminate comprising a thermoplastic backing material and a porous film, and wherein said backing material is bonded to said tip surface by melting of the backing material by heat applied by said molten resin.

10. A sealed case for housing equipment, said case comprising an injection molded resin body having an interior and an exterior, and having a through hole leading from said interior to said exterior, wherein said through hole is surrounded by a radial peripheral surface, wherein said through hole is covered with a water-repellent, porous, film which is permeable to air, but impermeable to liquids, wherein said water-repellent film overlies and is bonded to said radial peripheral surface by entry of molten resin from said resin body into pores of said film as a result of the application of heat and/or pressure to said resin body, and wherein only one side of said film is bonded to said resin body.

11. A sealed case according to claim 10, wherein said film is also oil-repellent.

12. A sealed case for housing equipment, said case comprising an injection molded resin body having an interior and an exterior, and having a through hole leading from said interior to said exterior, wherein said through hole is surrounded by a radial peripheral surface, wherein said through hole is covered with a water-repellent, porous, film which is permeable to air, but impermeable to liquids, wherein said water-repellent film overlies and is bonded to said radial peripheral surface, wherein said water-repellent film is a laminate comprising a thermoplastic backing material on one side and a porous film on the other side, wherein only said one side of said film is directly bonded to said resin body, and wherein said backing material is bonded to said resin body by a bond composed of a solidified molten material, said molten material consisting of molten resin of the resin body and molten thermoplastic of said backing material integrated with each other.

* * * * *

UNITED STATES PATENT AND TRADEMARK OFFICE
CERTIFICATE OF CORRECTION

PATENT NO. : 6,827,232 B1
DATED : December 7, 2004
INVENTOR(S) : Kouichi Hara, Atsushi Fukunishi and Takahito Katsuura It is certified that error appears in the above-identified patent and that said Letters Patent is hereby corrected as shown below:

<u>Title page,</u>
Item [57], ABSTRACT,
Line 3, "hole (10)" should read -- hole (50) --;
Line 6, "replacement" should read -- repellent --.

Signed and Sealed this

Fifth Day of April, 2005

JON W. DUDAS
*Director of the United States Patent and Trademark Office*